(12) United States Patent
Park et al.

(10) Patent No.: US 9,025,366 B2
(45) Date of Patent: May 5, 2015

(54) MAIN MEMORY SYSTEM STORING OPERATING SYSTEM PROGRAM AND COMPUTER SYSTEM INCLUDING THE SAME

(71) Applicant: Samsung Electronics Co., Ltd., Suwon-si (KR)

(72) Inventors: Young-Jin Park, Incheon (KR); Ilguy Jung, Hwaseong-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 36 days.

(21) Appl. No.: 14/040,595

(22) Filed: Sep. 27, 2013

(65) Prior Publication Data

US 2014/0098601 A1   Apr. 10, 2014

(51) Int. Cl.
*G11C 11/00* (2006.01)
*G11C 11/16* (2006.01)
*G06F 13/00* (2006.01)

(52) U.S. Cl.
CPC ............ *G11C 11/1675* (2013.01); *G06F 13/00* (2013.01)

(58) Field of Classification Search
CPC ....... G11C 11/1675; G11C 7/20; G06F 13/00
USPC .............. 365/158, 185.11, 148, 163
See application file for complete search history.

(56) References Cited

U.S. PATENT DOCUMENTS

| | | | |
|---|---|---|---|
| 5,293,610 A * | 3/1994 | Schwarz | 711/164 |
| 6,009,012 A * | 12/1999 | Sibigtroth et al. | 365/185.04 |
| 6,715,067 B1 | 3/2004 | Rhoads et al. | |
| 7,353,324 B2 * | 4/2008 | Tanaka | 711/103 |
| 7,945,772 B2 | 5/2011 | Kawano et al. | |
| 2011/0016300 A1 | 1/2011 | Lee | |
| 2011/0119456 A1 | 5/2011 | Ipek et al. | |
| 2011/0119538 A1 | 5/2011 | Ipek et al. | |
| 2012/0042376 A1 | 2/2012 | Dolgunov et al. | |

FOREIGN PATENT DOCUMENTS

| | | |
|---|---|---|
| JP | 2004-362426 | 12/2004 |
| JP | 2005-011120 | 1/2005 |
| JP | 2008-502988 A | 1/2008 |
| JP | 2009-151386 | 7/2009 |
| JP | 2010-271967 | 12/2010 |
| JP | 2011-192139 | 9/2011 |
| KR | 10-2006-0091358 A | 8/2006 |
| KR | 10-2001-0056103 A | 7/2010 |

* cited by examiner

*Primary Examiner* — Tan T. Nguyen
(74) *Attorney, Agent, or Firm* — Muir Patent Law, PLLC

(57) ABSTRACT

A main memory system is provided which includes a nonvolatile memory including a first memory area designated to store an operating system program and a second memory area designated to store user data; and a memory controller configured to control the nonvolatile memory such that the operating system program is loaded onto the second memory area from the first memory area. The nonvolatile memory may be one of a phase change RAM, a resistive RAM, and a magnetic RAM.

20 Claims, 14 Drawing Sheets

MAIN MEMORY SYSTEM STORING OPERATING SYSTEM PROGRAM AND COMPUTER SYSTEM INCLUDING THE SAME

CROSS-REFERENCE TO RELATED APPLICATIONS

A claim for priority under 35 U.S.C. §119 is made to Korean Patent Application No. 10-2012-0112514 filed Oct. 10, 2012, in the Korean Intellectual Property Office, the entire contents of which are hereby incorporated by reference.

BACKGROUND

As an information storing device, a semiconductor memory device may be volatile or nonvolatile. A typical computer system may use a DRAM as a main memory and a hard disk drive and a nonvolatile memory (e.g., a flash memory) as an auxiliary storage device. An operating system program or an application program may be stored at an auxiliary storage device including a nonvolatile memory, and may be loaded onto a main memory at execution.

As a new memory device field develops, the nonvolatile memory may be used as the main memory instead of the DRAM. In this case, a problem may arise to implement a computer system with fast booting speed and less error using the main memory having the nonvolatile memory.

SUMMARY

In one embodiment, a computer system includes a CPU; a nonvolatile memory including a first memory area designated to store an operating system program and a second memory area designated to store user data; and a memory controller configured to control the nonvolatile memory. At a booting operation of the computer system, the operating system program may be loaded onto the second memory area from the first memory area.

In example embodiments, the nonvolatile memory is one of a phase change RAM, a resistive RAM, and STT-MRAM.

In example embodiments, the memory controller manages division of the nonvolatile memory into the first and second memory areas and an access of the CPU to the first and second memory areas.

In example embodiments, the first memory area of the nonvolatile memory includes an operating system install layer or an operating system update layer.

In example embodiments, the operating system install layer is set to a read only space after an operating system is installed.

In example embodiments, an operating system update program is periodically stored at the operating system update area and is executed prior to a program stores at the operating system install area.

In example embodiments, a storage is further provided which is configured to store user data stored at the second memory area, the storage being one of a hard disk drive or a solid state drive.

In example embodiments, the nonvolatile memory device further comprises an ex-loader configured to install the operating system program; and an operating system address table configured to store an address of the first memory area.

In one embodiment, a method of controlling a main memory system that includes a nonvolatile memory includes: storing an operating system program at a first memory area of the nonvolatile memory; storing user data at a second memory area of the nonvolatile memory; and controlling the nonvolatile memory such that the operating system program is loaded onto the second memory area from the first memory area.

The method may further include loading the operating system program onto the second memory area from the first memory area during a booting operation of the main memory system.

The method may additionally include periodically storing an operating system update program at an operating system update area of the first memory area; and executing the operating system update program prior to a program being stored at an operating system install area of the first memory area.

In one embodiment, the nonvolatile memory includes a plurality of MRAM devices; the first memory area includes a first set of MRAM devices of the plurality of MRAM devices; and the second memory area includes a second set of MRAM devices of the plurality of MRAM devices, the second set including the remainder of MRAM devices of the plurality of MRAM devices not included in the first set.

The method may include storing the operating system program at a first memory area of the nonvolatile memory further includes receiving a user selection to store the operating system program at the first memory area of the nonvolatile memory.

The first memory area may include a first set of physical addresses; and the second memory area may include a second set of physical addresses different from the first set.

The method may include storing an application program received from an external storage at the second memory area, and executing the application program stored at the second memory area. The external storage may be one of a hard disk drive, a solid state drive, and a NAND flash device.

In one embodiment, a method of controlling a main memory that includes a nonvolatile memory includes: receiving a selection to store and install an operating system program at a first memory area of the nonvolatile memory; and loading the operating system program to a second memory area of the nonvolatile memory from the first memory area in order to execute the operating system program.

Receiving the selection may further include: receiving a selection by a user to store and install an operating system program at an MRAM.

The nonvolatile memory may include a plurality of MRAM devices; the first memory area may include a first set of MRAM devices of the plurality of MRAM devices; and the second memory area may include a second set of MRAM devices of the plurality of MRAM devices, the second set including the remainder of MRAM devices of the plurality of MRAM devices not included in the first set.

The method may include loading the operating system program onto the second memory area from the first memory area during a booting operation of the main memory.

In one embodiment, the second memory area is designated as an area for storing user data.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
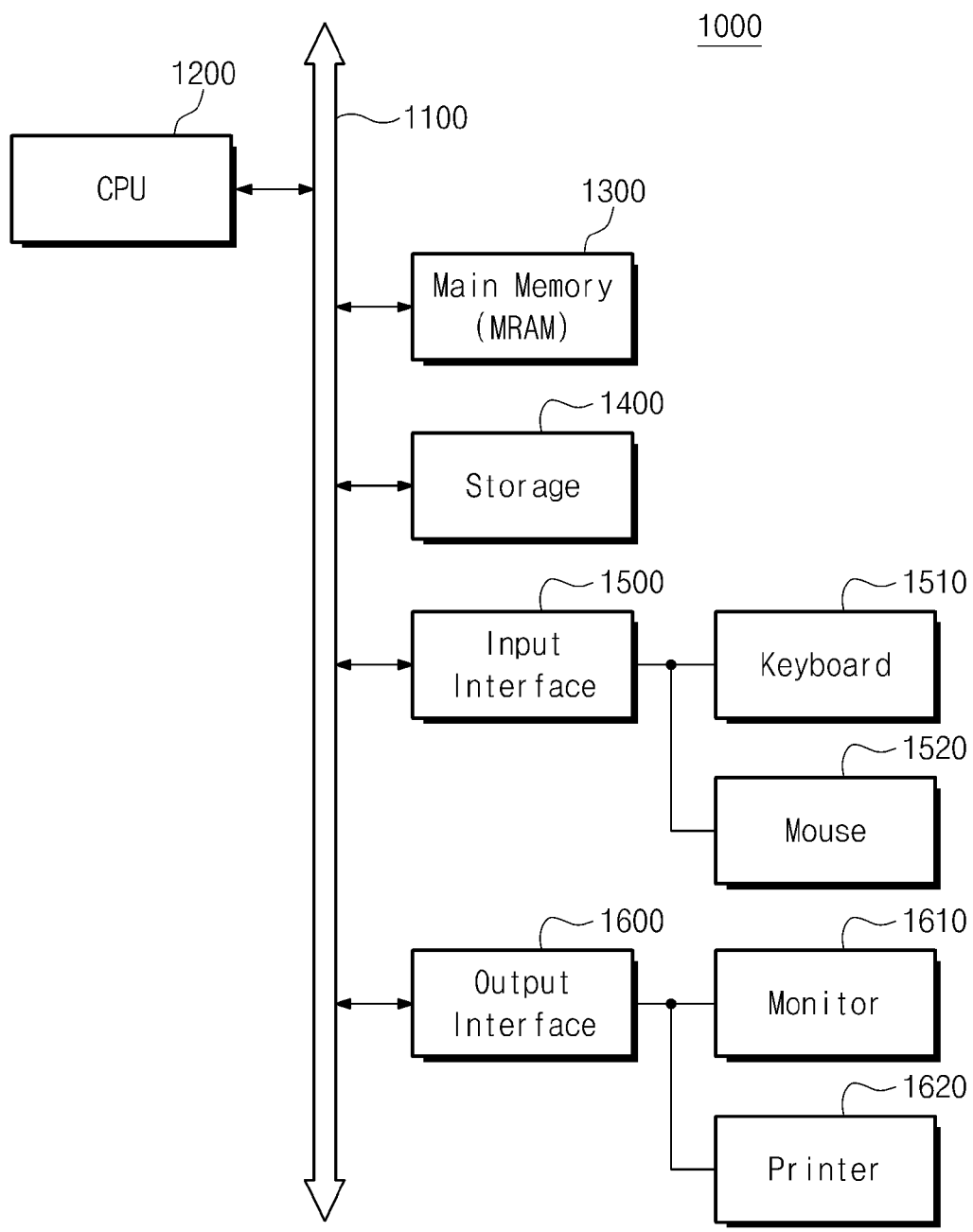
FIG. 1 is a block diagram schematically illustrating a computer system according to one exemplary embodiment.

Embodiments will be described in detail with reference to the accompanying drawings. The inventive concept, however, may be embodied in various different forms, and should not be construed as being limited only to the illustrated embodiments. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on", "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The below embodiments generally relate to a computer system, and more particularly, a computer system including a nonvolatile memory to store an operating system program.

FIG. 1 is a block diagram schematically illustrating a computer system according to one exemplary embodiment. Referring to FIG. 1, a computer system 1000 may include a CPU 1200, a main memory 1300, storage 1400, an input interface 1500, and an output interface 1600 which are electrically connected with a system bus 1100.

The computer system 1000 may be, for example, a mobile device, a personal computer, a server computer, or a general-purpose or specific-purpose computer system such as a programmable home appliance, a main frame computer, and so on.

The main memory 1300 may include nonvolatile memories. Herein, the term "memory" may be used to indicate medium at which the computer system 1000 stores data in short term or temporarily, like a working memory, a cache memory, and so on. The main memory 1300 may be used to store a file system type of data. Also, the main memory 1300 may include a read only space at which an operating system program is stored.

The storage 1400 may be formed of a hard disk drive (hereinafter, referred to as HDD) or a solid state drive (hereinafter, SSD). Herein, the term "storage" may be used to indicate storage medium to store user data in long term. For example, the storage 1400 may be used to store an application program, program data, and so on.

The input interface 1500 may be connected with input devices such as a key board 1510, a mouse 1520, and so on. Although not shown in figures, the input devices may further comprise a microphone, a scanner, and so on. A user may input a command, data, and information into the computer system 1000 through the input devices.

The output interface 1600 may be connected with output devices such as a monitor 1610, a printer 1620, and so on. Although not shown in figures, the output devices may further comprise a headset, an earphone, a speaker, and so on. Execution and processing results of the computer system 1000 on a user command may be output through the output devices. In recent years, in case of a tablet type of person computer system, a touch screen panel and a monitor may be combined together.

Although not shown in FIG. 1, the computer system 1000 may further comprise an application chip set, a camera image processor (CIS), a modem, and so on.

Figure 2:
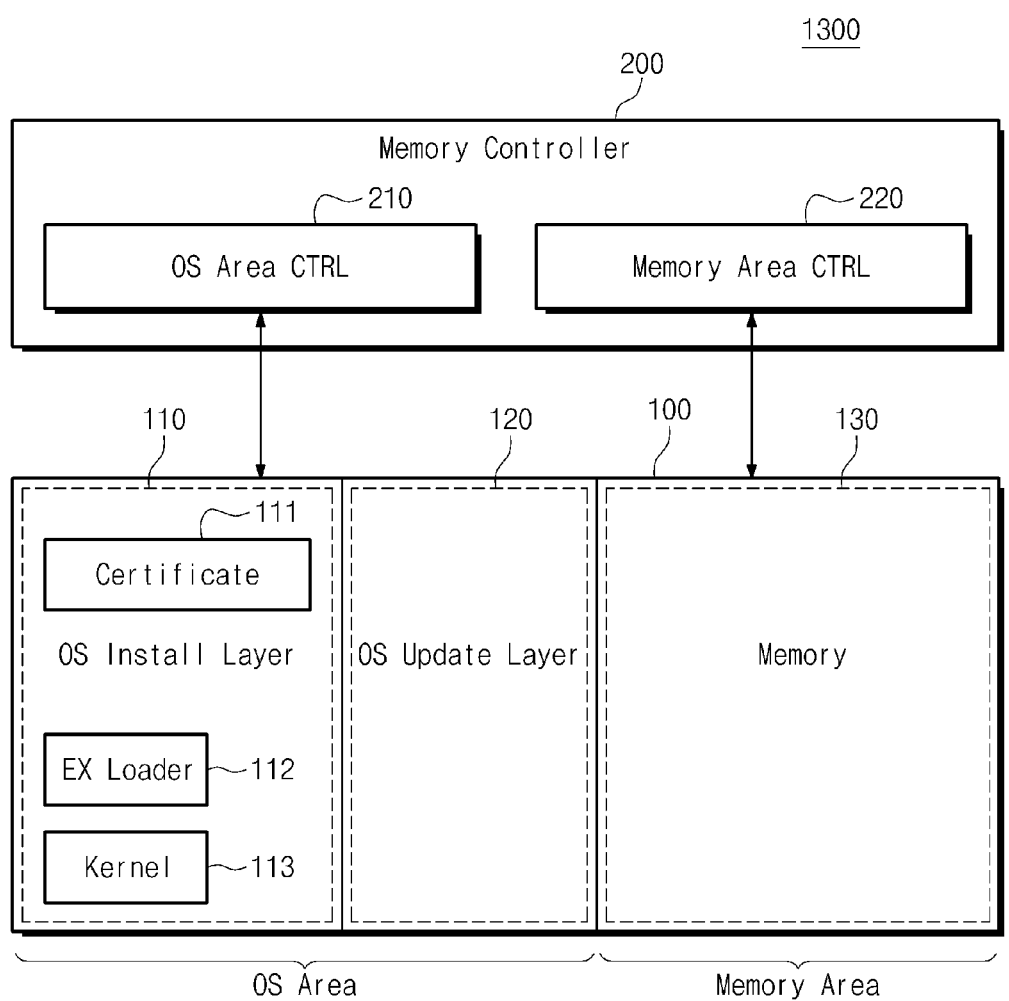
FIG. 2 is a block diagram schematically illustrating a main memory according to one exemplary embodiment.

FIG. 2 is a block diagram schematically illustrating a main memory according to one exemplary embodiment. Referring to FIGS. 1 and 2, a main memory 1300 may include a memory device 100 and a memory controller 200. The main memory 1300 including an operating system program may be located to be adjacent to a CPU 1200 of a computer system 1000 to improve a processing speed of a computing operation.

An operating system (hereinafter, referred to as "OS") may be system software which manages hardware and provides a service for execution of application software. Currently used operating systems may include Microsoft Windows, Android, Apple OS X, Linux, UNIX, and so on.

The memory device 100 may include a plurality of nonvolatile memories. The nonvolatile memory may be, for example, a PRAM (Phase change Random Access Memory) using a phase change material, an RRAM (Resistive Random Access Memory) using a variable resistance material (e.g., complex metal oxides), an MRAM (Magnetic Random Access Memory), or an FRAM (Ferroelectric Random Access Memory) using a ferroelectric capacitor.

The memory device 100 may include an OS area for storing an OS program and a memory area for storing user data. At booting of the computer system 1000, the OS program may be loaded onto the memory area from the OS area and then executed.

The OS area may include an OS install layer 110 and an OS update layer 120. The OS install layer 110 may be a read only space, and writing of new data at the OS install layer 110 may be limited if the OS program is installed. Information on an OS program, a fetch, a service pack, or a revised driver to be updated after installation of the OS program may be stored at the OS update layer 120.

The OS install layer 110 may include a certificate device 111, an ex-loader 112, a kernel 113, and so on.

The certificate device 111 may safely protect data by using a secret key or an inherent key of a certificate authority. The OS install layer 110 is capable of revising data when certified by the certificate device 111. This may prevent the OS install layer 110 from being infected or hacked by computer viruses. The certificate device 111 may use an advanced encryption standard (AES), a data integrity checking algorithm (e.g., message digit 5: MD5), and so on. The certificate device 111 can be stored by way of security association database (SAD).

The ex-loader 112 may play a role of transferring data stored at the OS area to the memory area 130. Application programs stored at storage 1400 (refer to FIG. 1) being an external storage device may be transferred to the memory area 130 through the ex-loader 112 and then executed.

The kernel 113 may be a core of an operating system, and may provide a variety of services needed to execute an application program. For example, the kernel 113 may manage assignment of memory and each process, and may decide sequences of the CPU 1200. Also, the kernel 113 may convert or transmit a variety of data to be processed at each system, and may control an access authority of a file system.

An OS update program may be periodically stored at the OS update layer 120. In the case that a program file having the same function is simultaneously stored at the OS install layer 110 and the OS update layer 120, a program stored at the OS update layer 120 may be executed prior to a program stored at the OS install layer 110.

The memory area 130 may perform a role of a main storage device at the computer system 1000. For example, the memory area 130 may be located to be adjacent to the CPU 1200 to store a program executed by the CPU 1200 or data to be referred by the program. In example embodiments, a user can delete all data stored at the memory area 130 under a specific condition such as power-off of a computer, generation of an erroneous operation, or so on.

The memory controller 200 may manage and control an overall operation of the memory device 100. In particular, the memory controller 200 may control division of the memory device 100 into the OS and memory areas. The memory controller 200 may control an access of the CPU 1200 to the OS and memory areas. The memory controller 200 may include an OS area controller 210 to control the OS install and update layers 110 and 120 of the memory device 100 and a memory area controller 220 to control the memory area 130.

Figure 3:
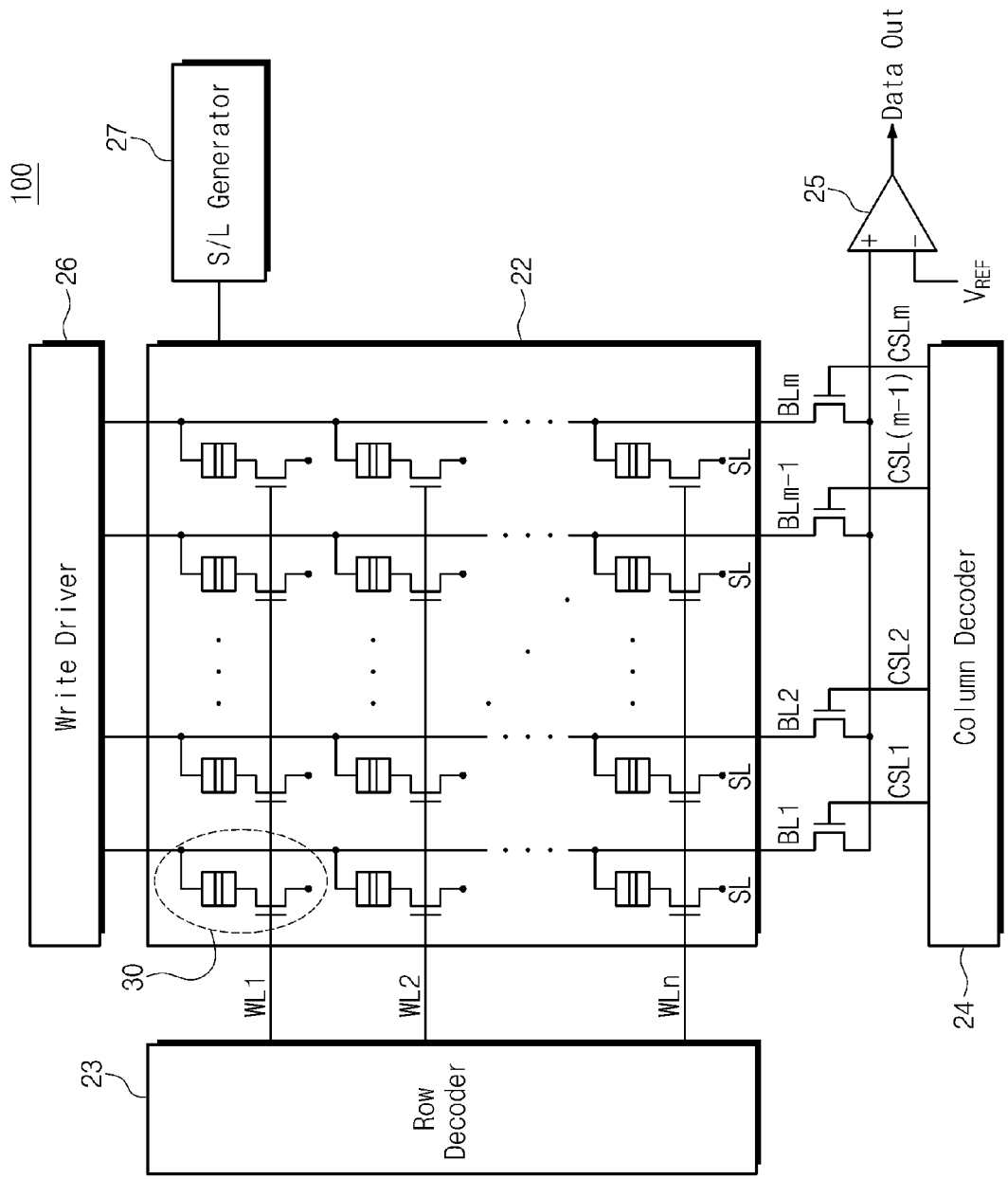
FIG. 3 is a block diagram schematically illustrating a device of FIG. 2 according to one exemplary embodiment.

FIG. 3 is a block diagram schematically illustrating a device of FIG. 2 according to an exemplary embodiment. Referring to FIG. 3, a memory device 100 may include a cell array 22, a row decoder 23, a column decoder 24, a sense amplifier 25, a write driver 26, and a source voltage generator 27.

The cell array 22 may include a plurality of word lines WL1 to WLn (n being a natural number more than 1), a plurality of bit lines BL1 to BLm (m being a natural number more than 1), and a plurality of memory cells 30 arranged at intersections of the word lines WL1 to WLn and the bit lines BL1 to BLm. In the case that the memory cells 30 are formed of STT-MRAM (spin transfer torque magnetic resistive random access memory) cells, each of the memory cells 30 may include a cell transistor and a magnetic tunnel junction (hereinafter, referred to as "MTJ") element having a magnetic material.

MTJ elements can be replaced with resistive elements of a phase change random access memory (PRAM) using a phase change material, a resistive random access memory (RRAM) using a variable resistance material such as complex metal oxide, a magnetic random access memory (MRAM) using a ferroelectric material, and so on. Resistance values of materials forming resistive elements may vary according to a level or direction of a current or voltage, and may be retained even at interruption of the current or voltage.

Each of the row decoder 23 and the column decoder 24 may include a plurality of switches. The row decoder 23 may select a word line in response to a row address, and the column decoder 24 may generate column selection signals CSL1 to CSLm to select one bit line. The plurality of bit lines BL1 to BLm may be connected with the write driver 26. The write driver 26 may apply a write current to the memory cell 30 in response to an external command.

At a data read operation, a voltage of a bit line may vary according to a resistance value of the memory cell 30. A voltage applied to the bit line may be transferred to the sense amplifier 25, and the sense amplifier 25 may sense a difference between the bit line voltage and a reference voltage Vref to output a data signal as a sensing result.

Figure 4:
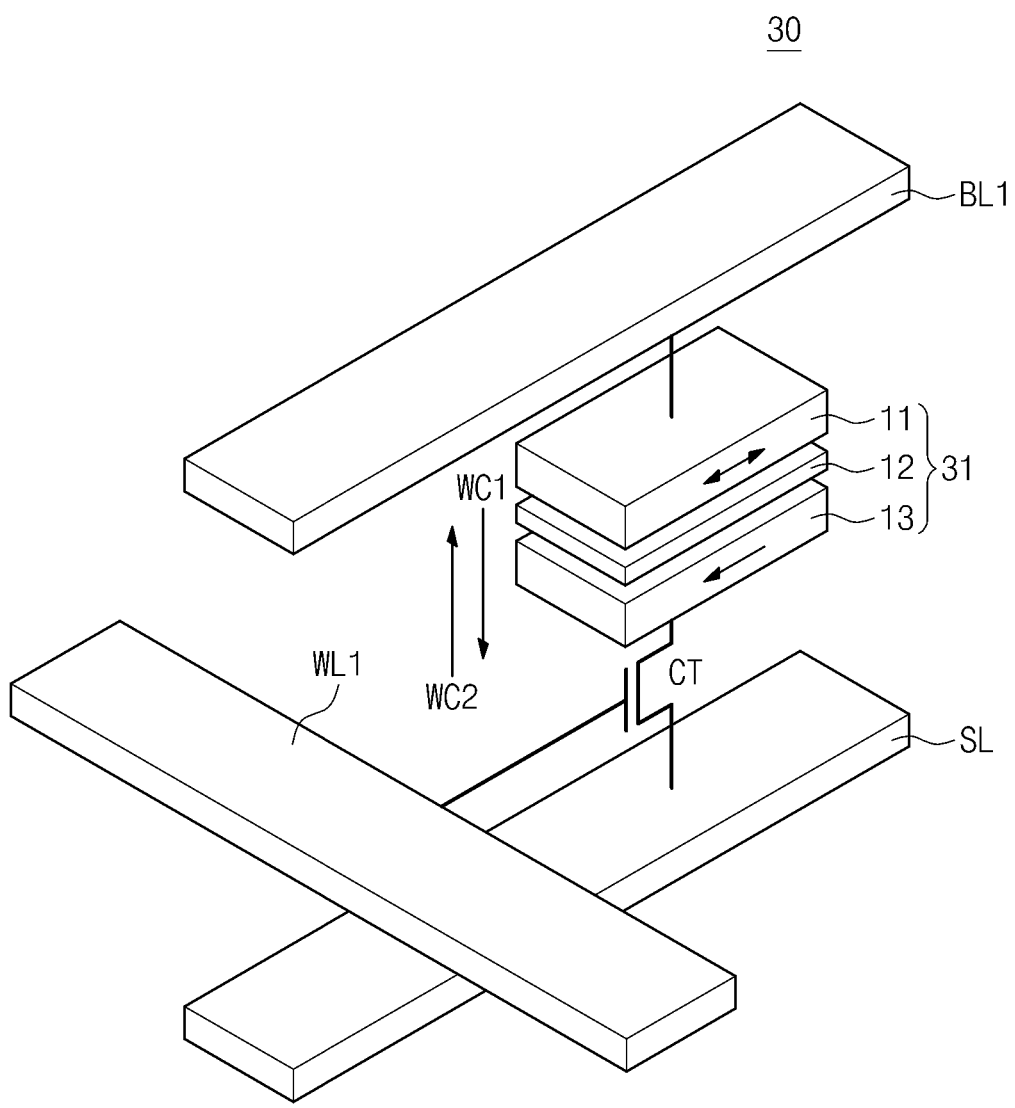
FIG. 4 is an exemplary perspective view of an STT-MRAM cell as a nonvolatile memory cell of FIG. 3.

FIG. 4 is a perspective view of an STT-MRAM cell as a nonvolatile memory cell of FIG. 3, according to one exemplary embodiment. A memory cell 30 may include an MTJ element 31 and a cell transistor CT. A gate of the cell transistor CT may be connected to a word line WL1, one end thereof may be connected to a bit line BL1 via the MTJ element 31, and the other end thereof may be connected to a source line SL.

The MTJ element 31 may include a pinned layer 13, a free layer 11, and a tunnel layer 12 interposed between the pinned layer 13 and the free layer 11. A magnetization direction of the pinned layer 13 may be pinned. A magnetization direction of the free layer 11 may have the same direction as the pinned layer 13 or a direction opposite to the pinned layer 13 according to a condition. An anti-ferromagnetic layer (not shown) may be further provided to pin a magnetization direction of the pinned layer 13.

At a write operation of the STT-MRAM cell, a high-level voltage may be applied to the word line WL1 to turn on the cell transistor CT, and a write current WC1/WC2 may be provided between the bit line BL1 and the source line SL.

At a read operation of the STT-MRAM cell, a high-level voltage may be applied to the word line WL1 to turn on the cell transistor CT, and a read current may be provided in a direction from the bit line BL1 to the source line SL. Data stored at the MTJ element 31 may be read according to a resistance value measured under the above bias condition.

Returning to FIG. 1, in a computer system 1000 according to one embodiment, an OS program to be executed at booting may be loaded onto a memory area from an OS area. Herein, a memory device may be formed of the STT-MRAM.

Figure 5:
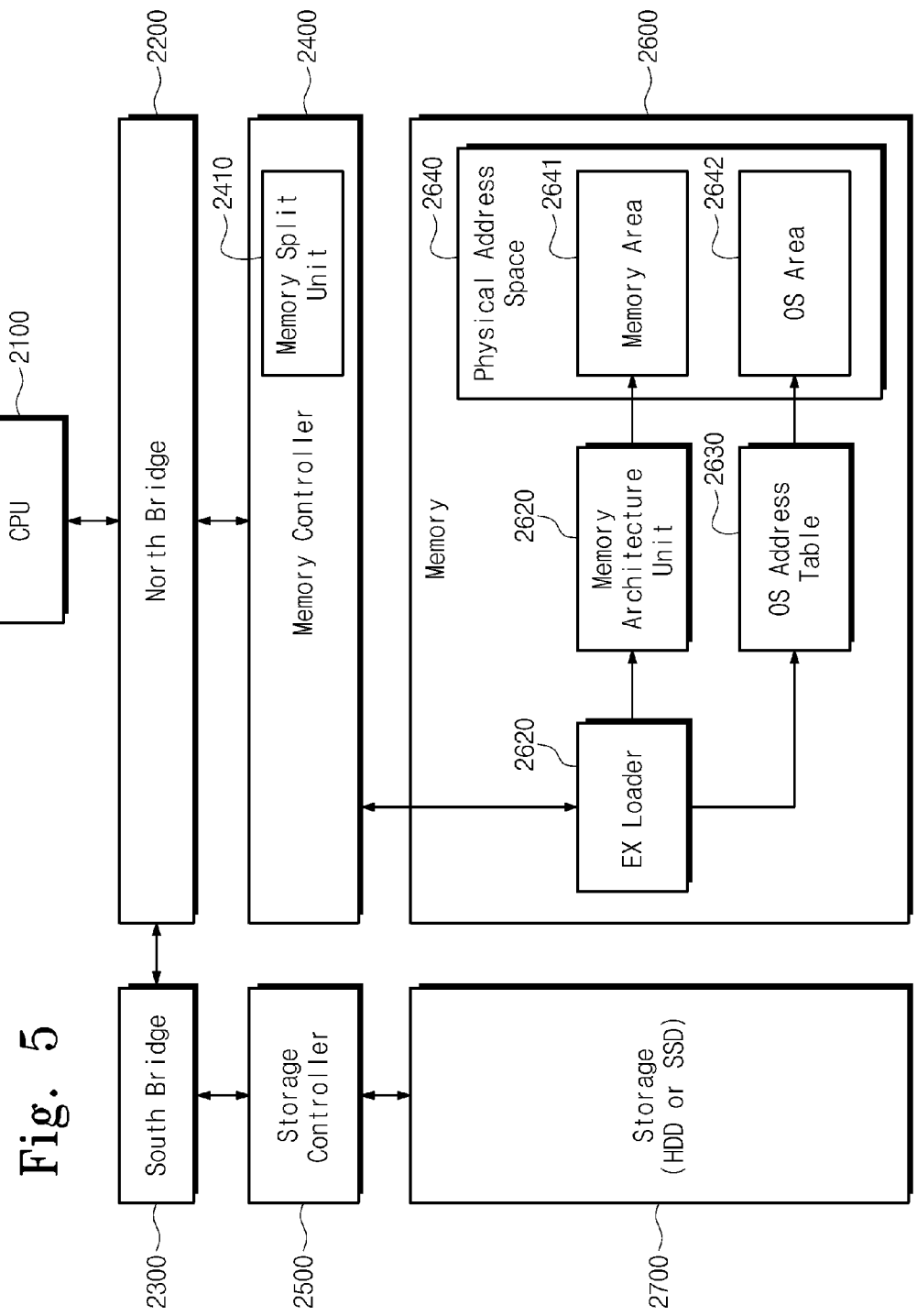
FIG. 5 is a block diagram schematically illustrating a computer system according to another exemplary embodiment.

FIG. 5 is a block diagram schematically illustrating a computer system according to another exemplary embodiment. Referring to FIG. 5, a computer system 2000 may include a CPU 2100, a north bridge 2200, a south bridge 2300, a memory controller 2400, a storage controller 2500, a memory device 2600, and storage 2700.

The north bridge 2200 may be a system controller which includes a host interface for connection with the CPU 2100. The north bridge 2200 may be controlled by the CPU 2100, and may be connected to the memory device 2600 through the memory controller 2400. In one embodiment, the memory device 2600 may perform a role of a main memory, and may use a DRAM interface.

The south bridge 2300 may be a system controller which connects a PCI (Peripheral component interconnection) bus and ISA (Industry Stand Architecture) buses. The south bridge 2300 may be controlled by the CPU 2100, and may be connected to the storage 2700 through the storage controller 2500.

The memory device 2600 may include an ex-loader 2610, a memory architecture unit 2620, an OS address table 2630, and a physical address space 2640. The memory architecture unit 2620 may allot a memory address for storing externally input data at the memory area 2641 and manage it by the segment or the page. The OS address table 2630 may store a physical address of the OS area 2642 at which an OS program is to be stored.

For example, if data input from the outside of the memory device 2600 is an OS program, the ex-loader 2610 may store the OS program at a physical address defined at the OS address table 2630. At this time, a storage space corresponding to the physical address may be placed in the OS area 2642. If data input from the outside of the memory device 2600 is not an OS program but another application program or typical data, the ex-loader 2610 may store data at a physical address defined at the memory architecture unit 2620. At this time, a storage space corresponding to the physical address may be placed in the memory area 2641.

The memory controller 2400 may include a memory split unit 2410. The memory split unit 2410 may control division of the memory device 2600 into the memory and OS areas 2641 and 2642.

Figure 6:
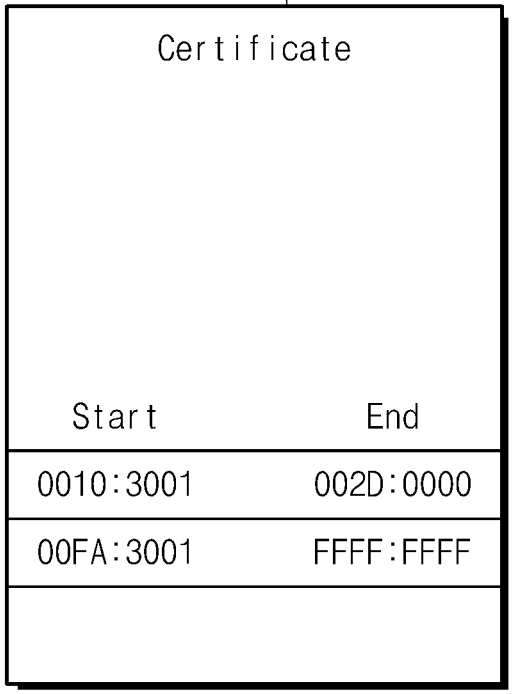
FIG. 6 is a diagram schematically illustrating an exemplary OS address table of FIG. 5.

FIG. 6 is a diagram schematically illustrating an OS address table of FIG. 5, according to one exemplary embodiment. An OS address table 2630 may store a physical address of an OS area 2642 at which an OS program is to be stored. Referring to FIG. 6, a physical address used to store an OS program may be defined such that a first storage space has a start address of 0010:3001 and an end address of 002D:0000. Also, a physical address used to store an OS program may be defined such that a second storage space has a start address of 00FA:3001 and an end address of FFFF:FFFF.

In FIGS. 5 and 6, a main memory 2600 of a computer system 2000 may be configured to store data input from external medium at an OS area 2642 when the data is an OS program and to store the data at a memory area 2641 when the data is another application program or data.

Figure 7:
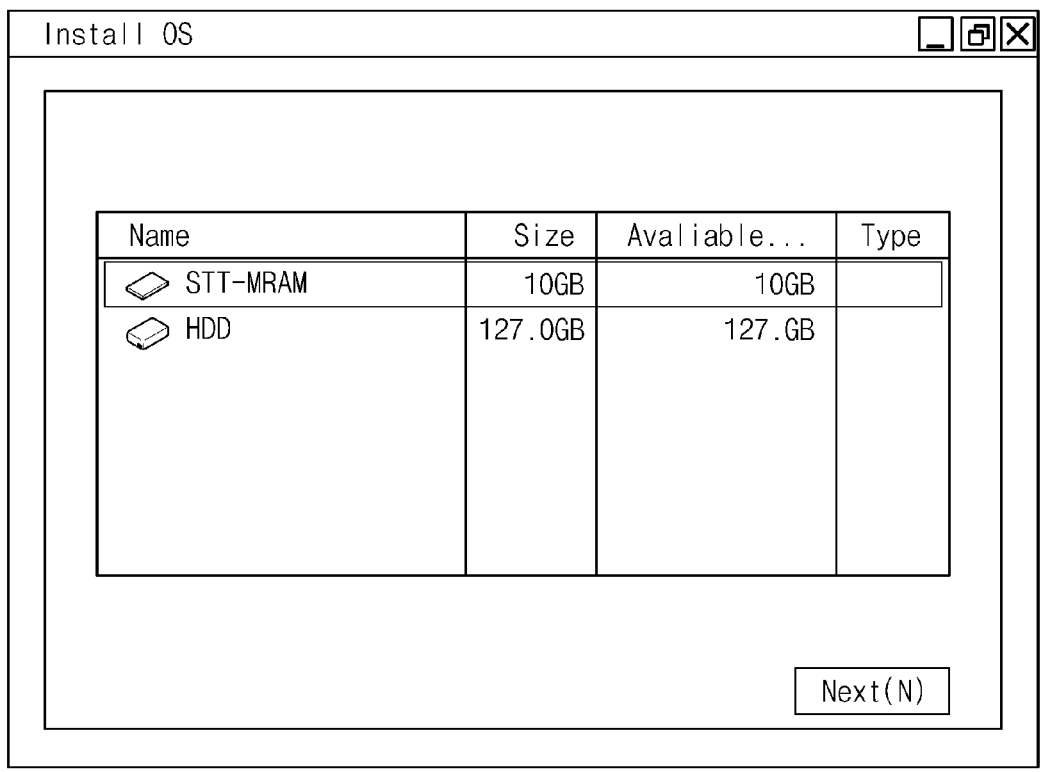
FIG. 7 is a diagram schematically illustrating an input interface according to one exemplary embodiment.

FIG. 7 is a diagram schematically illustrating an input interface according to one exemplary embodiment. A user of a computer system 2000 (refer to FIG. 5) may directly install an OS program at a wanted storage space using an input/output interface.

Referring to FIG. 7, when an OS program is installed at the computer system 2000, a menu window showing selection of a memory device and a disk space such as storage as a space for storing the OS program may be generated. In FIG. 7, there is illustrated an example in which an OS program is directly installed at SST-MRAM.

Figure 8:
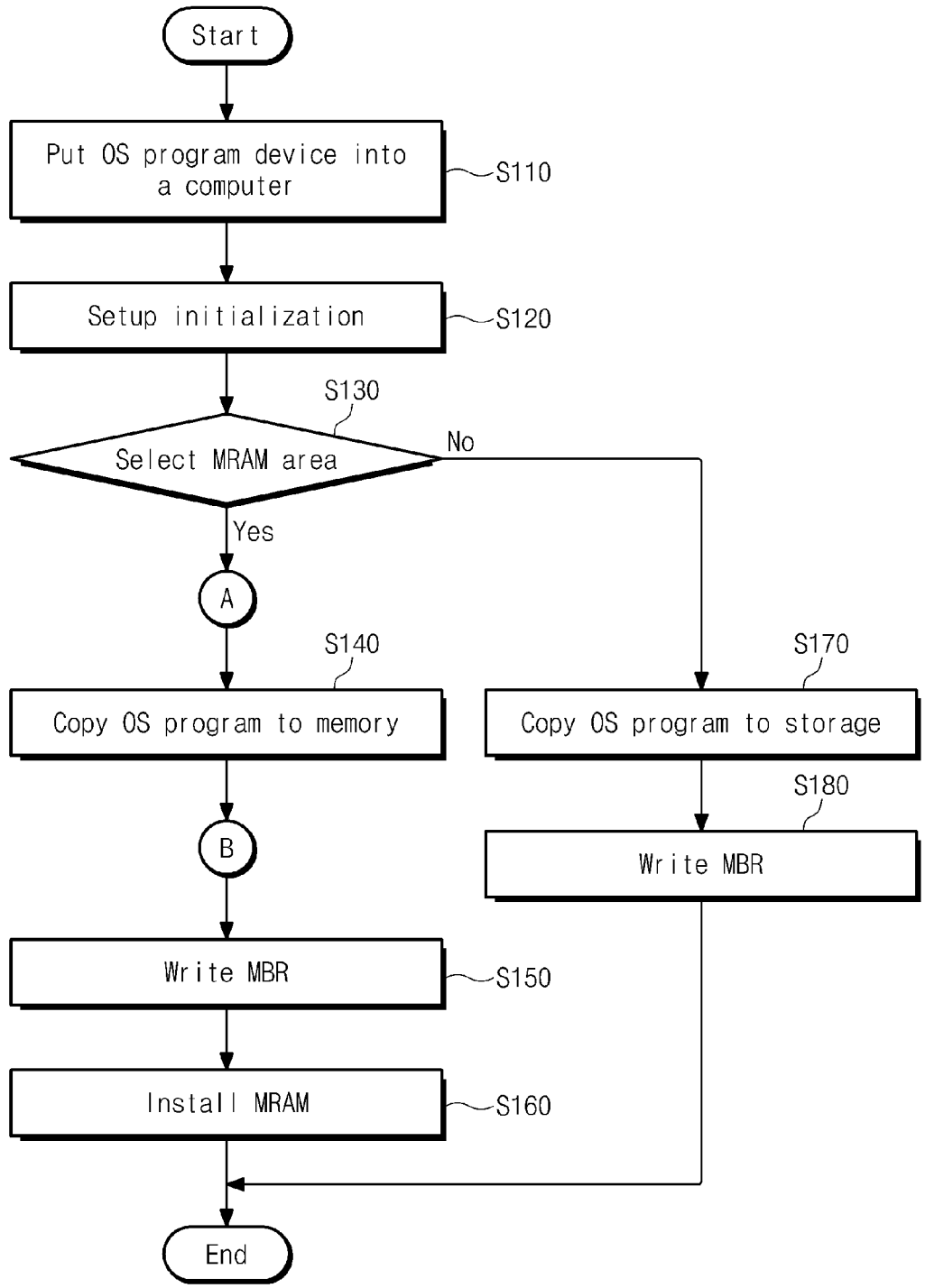
FIGS. 8 and 9 are flow charts illustrating an operation of installing an OS program at a computer system according to one exemplary embodiment.
Figure 9:
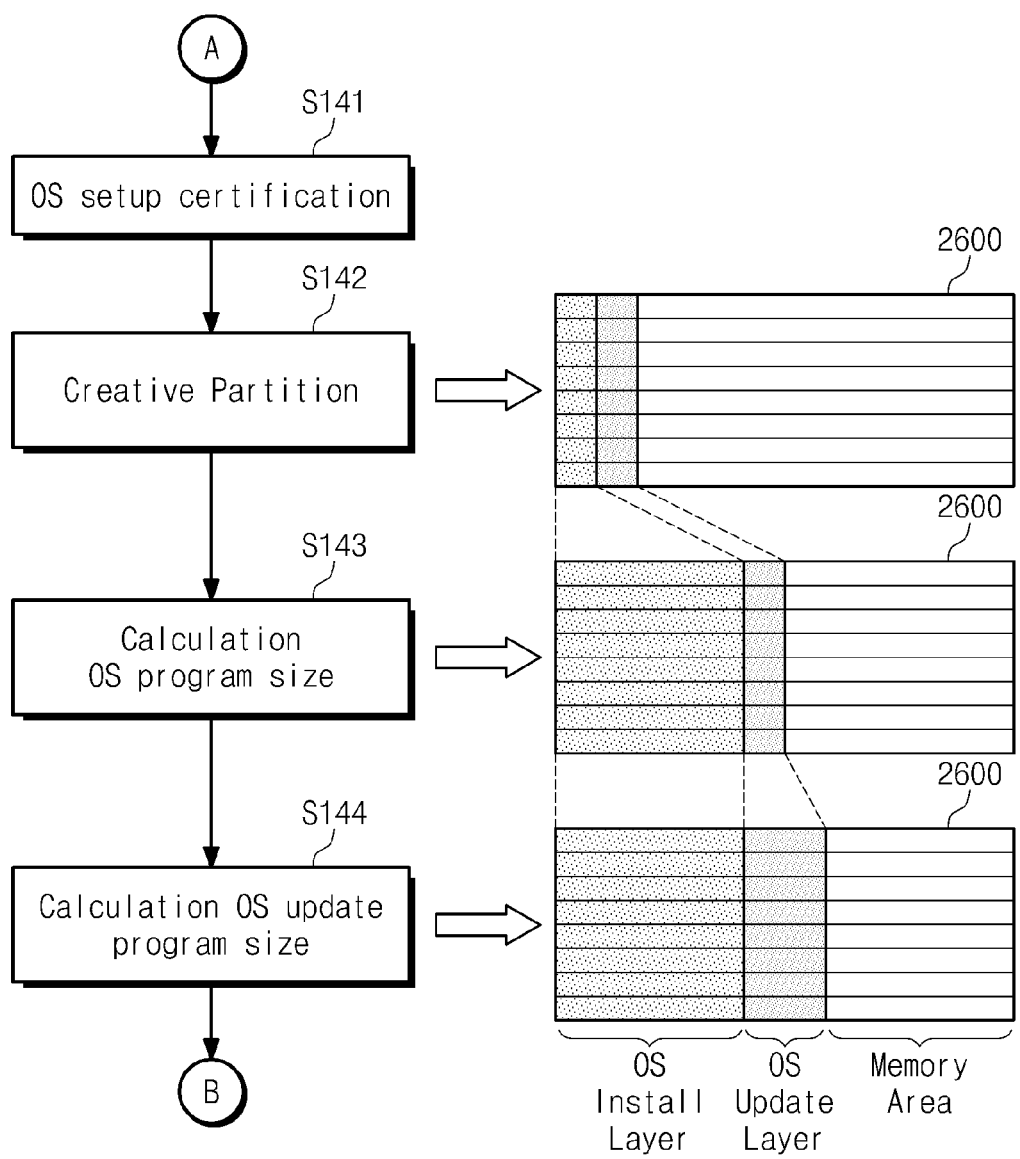

FIGS. 8 and 9 are flow charts illustrating an operation of installing an OS program at a computer system according to one exemplary embodiment.

Referring to FIGS. 5 and 8, in operation S110, a device where an OS program is stored may be put into a computer system 2000. In operation S120, the computer system 2000 may go to an initialization state for installation of an operating system. In operation S130, there may be determined whether a memory 2600 is selected by a user as a storage space where the OS program is to be installed. For example, the memory device 2600 and storage 2700 may continuously store an installed OS program regardless of power-on/off according to their nonvolatile characteristics.

If the memory device 2600 is selected by the user, in operation S140, the OS program may be stored at the memory device 2600 and then installed. In one embodiment, the memory device 2600 may include STT-MRAM cells.

Referring to FIG. 9, in operation S141, the computer system 2000 may install OS authentication certificate to install the OS program at the memory device 2600. In operation S142, a memory split unit 2410 of a memory controller 2400 may divide the memory device 2600 into three partitions: an OS install layer, an OS update layer, and a memory area. In operation S143, the computer system 2000 may calculate a file size of the OS program to set the OS install layer according to the measured file size. In operation S144, the computer system 2000 may calculate a file size of the OS update program to set an OS update layer according to the measured file size. Thus, the portions of the memory designated for the different functions (e.g., OS install layer, OS update layer, and memory area) may be set at particular sizes based on the size of the OS program and related information.

Although not shown in figures, division of the memory device into partitions may be changed variously. For example, an OS area for storing an OS program and a memory area for storing user data may be first created, and a file size of the OS program may be measured. Afterwards, the OS area may be divided into an OS install layer and an OS update layer may be created according to a file size of the OS program.

Returning to FIG. 8, if installation of the OS program is ended, in operation S150, a master boot record (MBR) may be written at the memory device 2600.

Returning to operation S130, if the storage 2700 is selected by the user as a space where the OS program is to be installed, in operation S170, the OS program may be stored at the storage 2700 and then installed. If installation of the OS program is ended, in operation S180, the master boot record (MBR) may be written at the storage 2700.

In the computer system 200 described with reference to FIGS. 7 to 9, one of the memory device 2600 and the storage 2700 may be selected by the user, and the OS program may be installed at the selected one of the memory device 2600 and the storage 2700.

Figure 10:
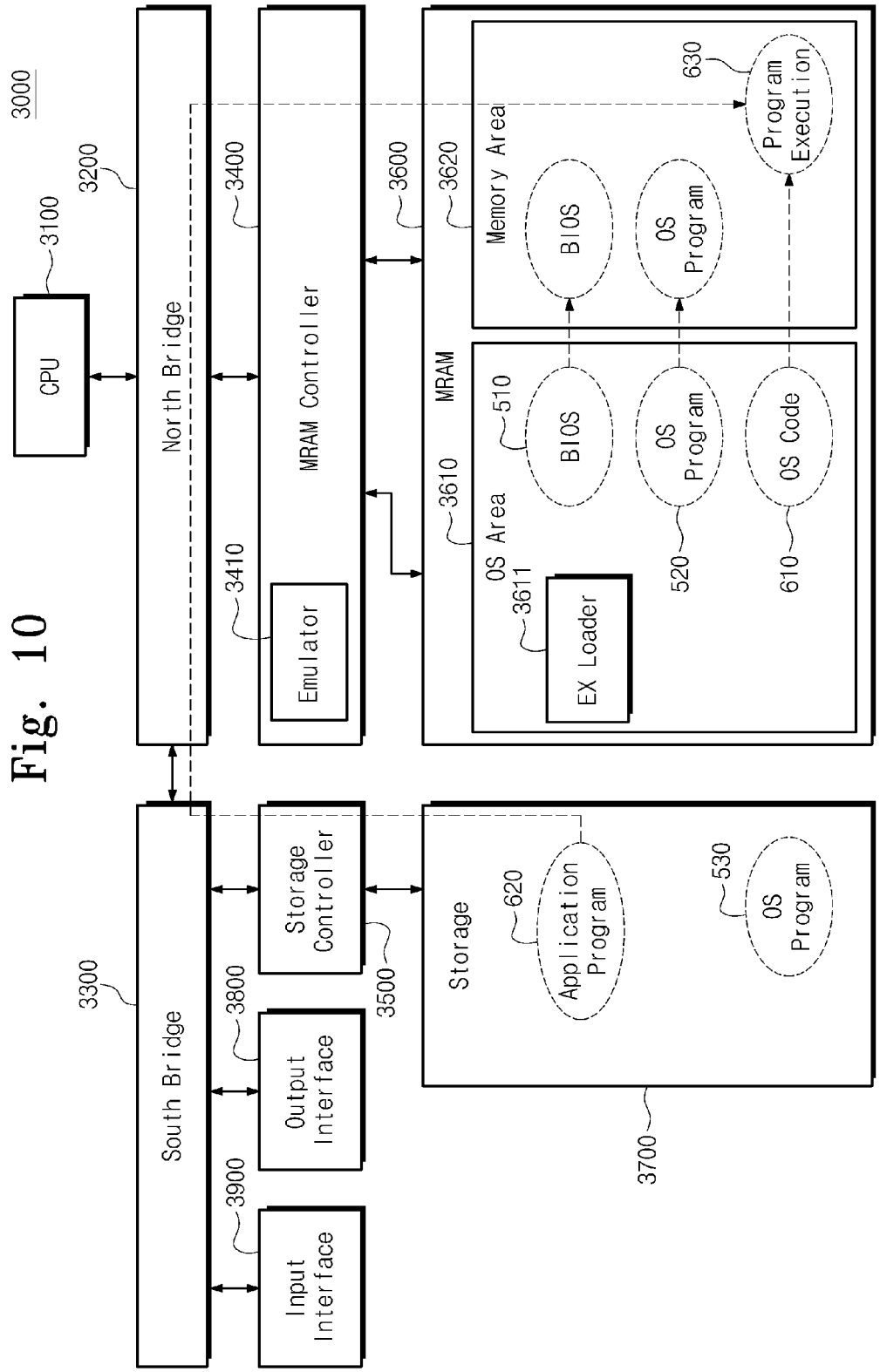
FIG. 10 is a block diagram schematically illustrating a computer system according to still another exemplary embodiment.

FIG. 10 is a block diagram schematically illustrating a computer system according to still another exemplary embodiment. Referring to FIG. 10, a computer system 3000 may include a CPU 3100, a north bridge 3200, a south bridge 3300, a memory controller 3400, a storage controller 3500, a memory device 3600, and storage 3700. The memory controller 3400 may include an emulator 3410. The emulator 3410 may perform controlling such that the memory device 3600 emulates a system and operation of the storage 3700.

The storage 3700 may store an application program 620 and mass data. The memory device 3600 may be divided into an OS area 3610 and a memory area 3620. A booting program 510 and an OS program 610 may be stored at the OS area 3610. In the computer system 3000, the OS program 610 may be loaded onto the memory area 3620 to execute an operating system.

As an operation of the computer system 3000, for example, information may be received from an input interface 3900 connected with a keyboard and a mouse, and the input information may be sent to the memory area 3620 through the south bridge 3300 and the north bridge 3200. Afterwards, the CPU 3100 may process information provided from the memory area 3620 to send a processed result to a graphic card through an output interface 3800. The processed result may be shown through a monitor screen under the control of the graphic card.

Figure 11:
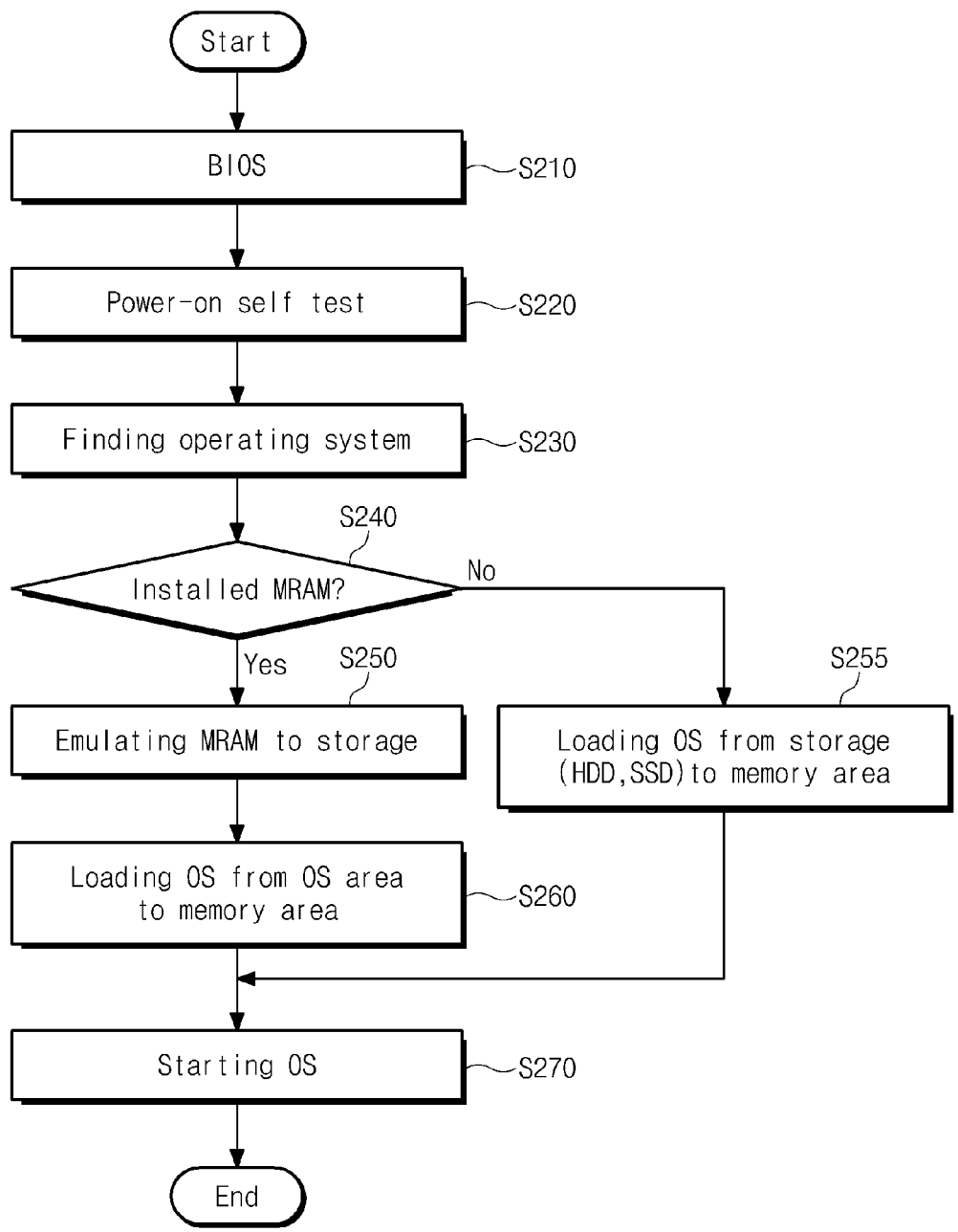
FIG. 11 is a flow chart illustrating a booting operation of a computer system according to an exemplary embodiment.

FIG. 11 is a flow chart illustrating an exemplary booting operation of a computer system according to another embodiment. Below, a booting operation of a computer system according to one embodiment will be described with reference to FIGS. 10 and 11.

In operation S210, BIOS (Basic Input Output System) 510 may be executed. If a computer system 3000 is powered on, the BIOS 510 may be loaded onto a memory area 3620 from an OS area 3610 and then executed.

In operation S220, POST (Power-On Self-Test) may be performed. As a result, there may be performed operations of self-testing and initializing hardware components of the computer system 3000.

In operation S230, an operating system may be searched. For example, an OS program 520 to be used at the computer system 3000 may be searched for.

In operation S240, whether to install the OS program at an MRAM may be determined. The computer system 3000 may confirm that the OS program 520 is stored at an OS area 3610 of a memory device 3600. Herein, the memory device 3600 may include a plurality of MRAM cells having a nonvolatile characteristic.

In operation S240, whether the OS program is installed at the MRAM may be determined. If so, the method proceeds to operation S250, in which for execution of a booting operation, an emulator 3410 of a memory controller 3400 emulates the OS program 520 stored at the memory device 3600 in a storage implementing method.

In operation S260, the OS program 520 stored at the OS area 3610 may be loaded onto the memory area 3620. In operation S270, the CPU 3100 may execute the OS program 520 stored at the memory area 3620.

Returning to operation S240, if the OS program is determined not to be installed at the MRAM, the method proceeds to operation S255, in which an operating system may be loaded onto a memory area from storage. In the computer system 3000, an OS program 530 may be stored at storage 370. The OS program 530 stored at the storage 370 may be loaded onto the memory area 3620.

In operation S270, the OS program 530 may be executed. At this time, the OS program 530 may be transferred to the memory area 3620 from the storage 3700 through south and north bridges 3300 and 3200.

Since a time taken to load the OS program 520 stored at the OS area 3610 onto the memory area 3620 is shorter than a time taken to load the OS program 530 stored at the storage 3700 onto the memory area 3620, a booting time may be shortened. With the computer system illustrated in FIG. 11, it is possible to perform a booting operation quickly and reliably using an OS program stored at the memory device 3600.

Figure 12:
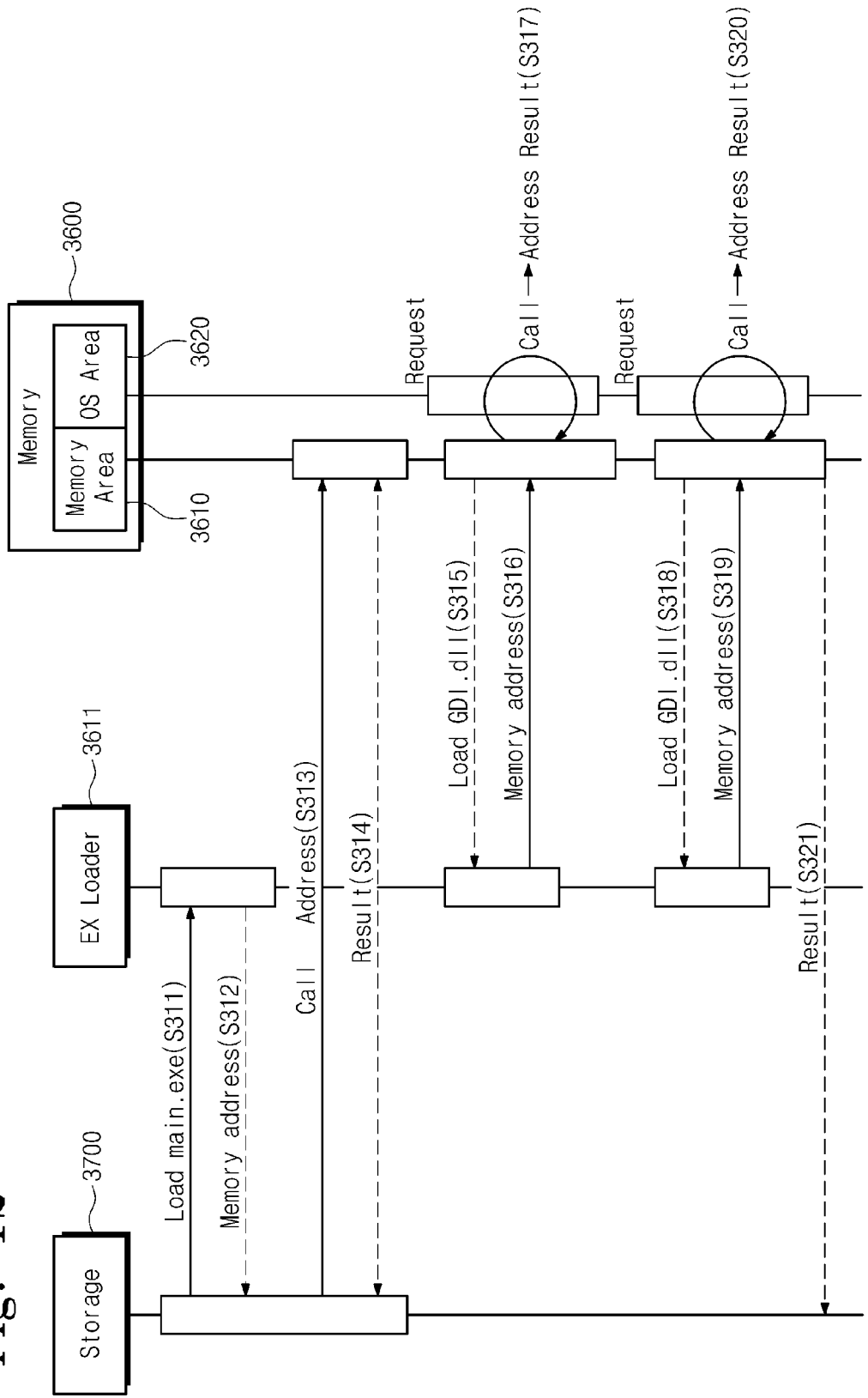
FIG. 12 is a diagram illustrating a sequence in which a computer system according to one exemplary embodiment executes an application program.

FIG. 12 is a diagram illustrating a sequence in which a computer system according to one exemplary embodiment executes an application program.

Referring to FIGS. 10 and 12, an external command may be provided to a computer system 3000 through an input interface 3900. An ex-loader 3611 of a memory device 3600 may receive command information provided from an external device (S311). Afterwards, the ex-loader 3611 may send a memory address of an application program 620 stored at storage 3700 to the storage 3700 (S312). The storage 3700 may load the application program 620 stored at the input memory address onto the memory area 3610 through south and north bridges 3300 and 3200 (S313). The memory area 3610 may check loading of the application program 620 to send a result signal to the storage 3700 (S314).

While the application program 620 is executed, the memory area 3610 may further request GDI (Graphic Device Interface) files being one of an OS code 610 at the ex-loader 3611 (S315). In this case, the ex-loader 3611 may send a memory address of the OS code 610 including corresponding GDI files (5316). At this time, the memory address may be placed at the OS area 3610. According to a request of the CPU 3100, the OS code 610 in the OS area 3610 may be sent to the memory area 3620 to operate as a part of an execution program 630 (S317).

If the execution program 630 operates under the control of the CPU 3100, the OS code 610 placed at the OS area 3610 may be again requested (S318). The ex-loader 3611 may send a corresponding memory address to the OS area 3610 (S319). The OS code 610 placed at the OS area 3610 may be sent to the memory area 3620 to operate as a part of the execution program 630 (S320). If requested operations are completed, a result signal may be sent to the storage 3700 (S321).

Although not shown in figures, in the case that the OS code 620 is stored at the storage 3700, not the OS area 3610, the OS code 620 may be loaded onto the memory area 3620 through south and north bridges 3300 and 3200. In this case, an operation of an operating program may take a long time. However, as illustrated in FIG. 12, if the OS code 620 is stored at the OS area 3610, it is possible to save a time taken to load the OS code 620 onto the memory area 3620.

Figure 13:
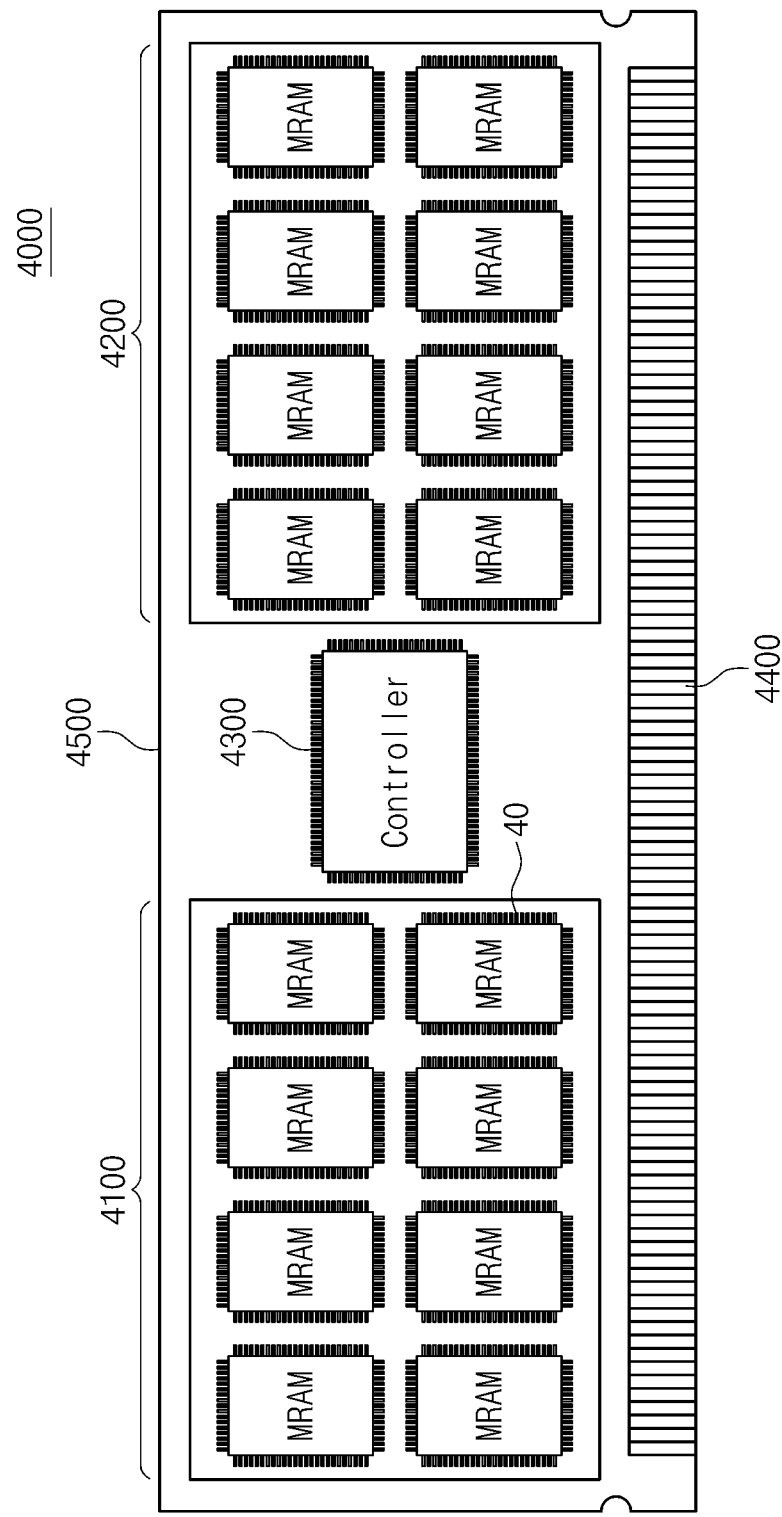
FIG. 13 is a block diagram schematically illustrating a memory module according to one exemplary embodiment.

FIG. 13 is a block diagram schematically illustrating a memory module according to one exemplary embodiment. Referring to FIG. 13, a memory module 4000 may include a plurality of MRAM devices such as MRAM chips 40, a controller 4300, a connector 4400, and a printed circuit board 4500.

The plurality of MRAM chips 40 may be divided into an OS area 4100 to store OS programs and a memory area 4200 to store data to be executed by a CPU. When a computer system operates, an OS program may be loaded onto the memory area from the OS area and then executed.

The plurality of MRAM chips 40 may be mounted on upper and lower surfaces of the printed circuit board 4500. The connector 4400 may be electrically connected with the plurality of MRAM chips 40 through conductive lines (not shown). The connector 4400 may be inserted into a slot of a main board of the computer system.

The controller 4300 may control writing/erasing of data stored at MRAM cells in the MRAM chips 40. The controller 4300 may be provided on the printed circuit board 4500 as a separate chip. However, the controller 4300 can be built in the MRAM chips 40. The controller 4300 can be disposed outside the memory module 4000.

Figure 14:
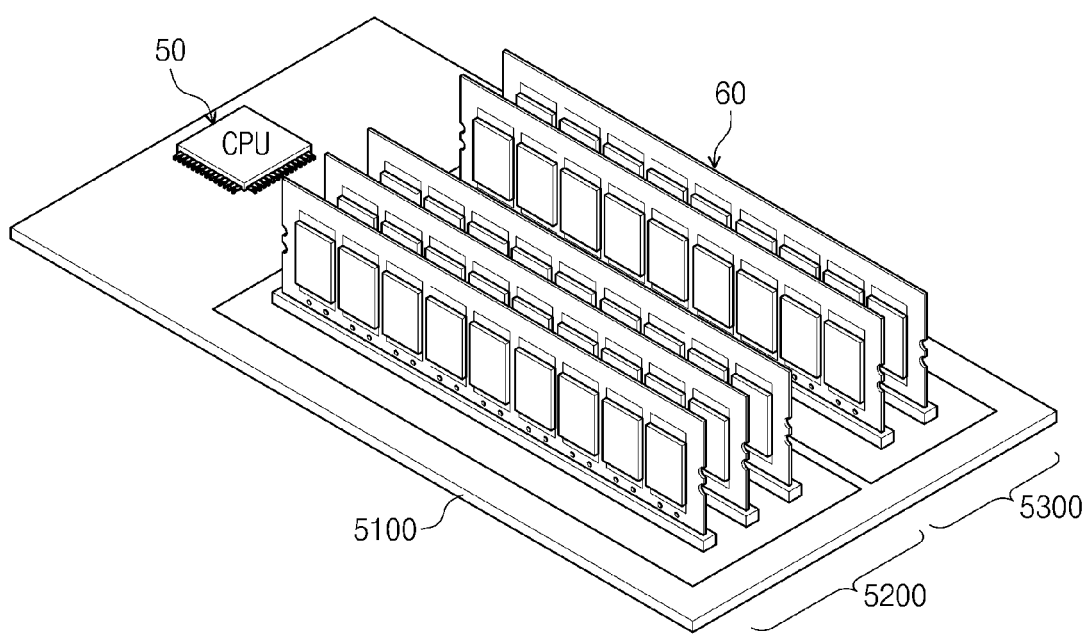
FIG. 14 is a diagram schematically illustrating a main board and a plurality of memory modules, according to one exemplary embodiment.

FIG. 14 is a diagram schematically illustrating a main board and a plurality of memory modules. Referring to FIG. 14, a main board 5100 may be a board for mounting fundamental components at a computer system, and a plurality of memory modules 60 may be mounted at the main board 5100.

The memory modules 60 may be divided into an OS area 5200 to store OS programs and a memory area 5300 to store data to be executed by a CPU. When a computer system operates, an OS program may be loaded onto the memory area from the OS area and then executed.

A plurality of electronic parts other than the CPU 50 and the memory modules 60 may be disposed and mounted at the main board 5100. Also, circuit patterns electrically connected with a plurality of electronic parts may be formed at the main board 5100.

In FIG. 13, division into an OS area and a memory area may be performed by the memory chip of a memory module. In FIG. 14, division into an OS area and a memory area may be performed by a unit of plurality of memory modules. In addition, division into an OS area and a memory area may be performed within a memory chip.

As an OS program is stored at a memory area located to be adjacent to a CPU, it is possible to improve a booting speed and a program-execution speed. Also, as security of a memory area storing an OS program is tightened up, it is possible to reduce generation of errors and to improve reliability of data.

While the present disclosure has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A main memory system comprising:
    a nonvolatile memory including a first memory area designated to store an operating system program and a second memory area designated to store user data; and
    a memory controller configured to control the nonvolatile memory such that the operating system program is loaded onto the second memory area from the first memory area.

2. The main memory system of claim 1, wherein the nonvolatile memory is a single type of memory including one of a phase change RAM, a resistive RAM, and a magnetic RAM.

3. The main memory system of claim 1, wherein the nonvolatile memory is STT-MRAM.

4. The main memory system of claim 1, further comprising:
    an ex-loader configured to install the operating system program; and
    an operating system address table configured to store an address of the first memory area.

5. The main memory system of claim 1, wherein the first memory area of the nonvolatile memory includes an operating system install layer or an operating system update layer.

6. The main memory system of claim 5, wherein the operating system install layer is a read only space.

7. A method of controlling a main memory system that includes a nonvolatile memory, the method comprising:
    storing an operating system program at a first memory area of the nonvolatile memory;
    storing user data at a second memory area of the nonvolatile memory; and
    controlling the nonvolatile memory such that the operating system program is loaded onto the second memory area from the first memory area.

8. The method of claim 7, further comprising:
    loading the operating system program onto the second memory area from the first memory area during a booting operation of the main memory system.

9. The method of claim 8, further comprising:
    periodically storing an operating system update program at an operating system update area of the first memory area; and
    executing the operating system update program prior to a program being stored at an operating system install area of the first memory area.

10. The method of claim 7, wherein:
    the nonvolatile memory includes a plurality of MRAM devices;
    the first memory area includes a first set of MRAM devices of the plurality of MRAM devices; and
    the second memory area includes a second set of MRAM devices of the plurality of MRAM devices, the second set including the remainder of MRAM devices of the plurality of MRAM devices not included in the first set.

11. The method of claim 7, wherein:
    storing the operating system program at a first memory area of the nonvolatile memory further includes receiving a user selection to store the operating system program at the first memory area of the nonvolatile memory.

12. The method of claim 7, wherein:
    the first memory area includes a first set of physical addresses; and
    the second memory area includes a second set of physical addresses different from the first set.

13. The method of claim 7, further comprising:
    storing an application program received from an external storage at the second memory area.

14. The method of claim 13, further comprising:
    executing the application program stored at the second memory area.

15. The method of claim 13, wherein:
the external storage is one of a hard disk drive, a solid state drive, and a NAND flash device.

16. A method of controlling a main memory that includes a nonvolatile memory, the method comprising:
receiving a selection to store and install an operating system program at a first memory area of the nonvolatile memory; and
loading the operating system program to a second memory area of the nonvolatile memory from the first memory area in order to execute the operating system program.

17. The method of claim 16, wherein receiving the selection further includes:
receiving a selection by a user to store and install an operating system program at an MRAM.

18. The method of claim 16, wherein:
the nonvolatile memory includes a plurality of MRAM devices;
the first memory area includes a first set of MRAM devices of the plurality of MRAM devices; and
the second memory area includes a second set of MRAM devices of the plurality of MRAM devices, the second set including the remainder of MRAM devices of the plurality of MRAM devices not included in the first set.

19. The method of claim 16, further comprising:
loading the operating system program onto the second memory area from the first memory area during a booting operation of the main memory.

20. The method of claim 16, wherein:
the second memory area is designated as an area for storing user data.

* * * * *